US009148984B2

(12) United States Patent
Tong et al.

(10) Patent No.: US 9,148,984 B2
(45) Date of Patent: Sep. 29, 2015

(54) HIGH-POWER ELECTROMAGNETIC ASSEMBLY

(71) Applicant: DELTA ELECTRONICS (Shanghai) CO., LTD., Shanghai (CN)

(72) Inventors: Aixing Tong, Shanghai (CN); Teng Liu, Shanghai (CN)

(73) Assignee: DELTA ELECTRONICS (SHANGHAI) CO., LTD. (CN)

( * ) Notice: Subject to any disclaimer, the term of this patent is extended or adjusted under 35 U.S.C. 154(b) by 327 days.

(21) Appl. No.: 13/846,679

(22) Filed: Mar. 18, 2013

(65) Prior Publication Data

US 2014/0118946 A1 May 1, 2014

(30) Foreign Application Priority Data

Oct. 25, 2012 (CN) .......................... 2012 1 0411821

(51) Int. Cl.
*H05K 7/20* (2006.01)
*H01F 27/28* (2006.01)
*H01F 27/32* (2006.01)

(52) U.S. Cl.
CPC ........ *H05K 7/20909* (2013.01); *H01F 27/2876* (2013.01); *H01F 27/322* (2013.01)

(58) Field of Classification Search
CPC . G06F 1/181–1/182; H05K 7/20218–7/20381; H05K 7/20409–7/20418; H01L 23/367–23/3677; H01L 23/473; F28F 3/02; F28F 13/06–13/125
USPC ........................ 361/676–678, 679.46–679.54, 361/688–723, 679.47, 679.52, 679.53; 165/80.1–80.5, 104.33, 185; 174/15.1–15.3, 16.1–16.3, 547, 548; 257/712–722, E23.088; 24/453, 24/458–459; 454/184
See application file for complete search history.

(56) References Cited

U.S. PATENT DOCUMENTS

| | | | | |
|---|---|---|---|---|
| 5,462,685 A | * | 10/1995 | Raj et al. ................... | 252/62.56 |
| 7,751,193 B2 | * | 7/2010 | Tominaga et al. ............ | 361/715 |
| 7,876,561 B2 | * | 1/2011 | Schnetzka et al. ........... | 361/699 |
| 8,050,045 B2 | * | 11/2011 | Okuzawa et al. ............. | 361/763 |
| 8,059,404 B2 | * | 11/2011 | Miller et al. ................. | 361/699 |
| 8,174,830 B2 | * | 5/2012 | Lower et al. ................. | 361/699 |
| 2006/0232942 A1 | * | 10/2006 | Nakatsu et al. .............. | 361/710 |
| 2007/0242426 A1 | * | 10/2007 | Coster et al. ................. | 361/687 |
| 2008/0068793 A1 | * | 3/2008 | Ishimine ...................... | 361/688 |
| 2008/0084668 A1 | * | 4/2008 | Campbell et al. ............ | 361/702 |
| 2008/0192428 A1 | * | 8/2008 | Clayton et al. ............... | 361/687 |
| 2009/0109713 A1 | * | 4/2009 | Schnetzka et al. ............. | 363/34 |
| 2009/0219697 A1 | * | 9/2009 | Gaigler et al. ............... | 361/711 |
| 2009/0289584 A1 | * | 11/2009 | Townsend et al. ......... | 318/400.4 |
| 2010/0110638 A1 | * | 5/2010 | Yumoto et al. ............... | 361/709 |
| 2010/0157531 A1 | * | 6/2010 | Mason et al. ................. | 361/697 |
| 2010/0226093 A1 | * | 9/2010 | Beaupre et al. .............. | 361/699 |
| 2010/0290490 A1 | * | 11/2010 | Hammel et al. ............... | 372/36 |

(Continued)

*Primary Examiner* — Anthony Haughton
*Assistant Examiner* — Razmeen Gafur
(74) *Attorney, Agent, or Firm* — Lowe Hauptman & Ham, LLP

(57) ABSTRACT

The present disclosure provides a high-power electromagnetic assembly comprising an iron core and a coil winding around the iron core, the coil having at least one coil layer, wherein a heat sink is provided between the iron core and an adjacent coil layer and/or between two adjacent coil layers. The heat sink comprises a first panel, a second panel and multiple supporting structures in connection with the first and second panels, and the first panel, the second panel and the supporting structures together constitute multiple air channels for cooling airflows passing therethrough.

35 Claims, 28 Drawing Sheets

(56) References Cited

U.S. PATENT DOCUMENTS

2010/0302737 A1* 12/2010 Yankoski et al. ............. 361/709
2010/0328883 A1* 12/2010 Ledezma et al. ............. 361/690
2011/0122578 A1*  5/2011 Guan ........................... 361/690
2011/0141690 A1*  6/2011 Le et al. ....................... 361/689
2011/0176278 A1*  7/2011 Park et al. .................... 361/712
2011/0215890 A1*  9/2011 Abolhassani et al. .......... 336/60
2011/0292613 A1* 12/2011 Deng et al. ................... 361/720

* cited by examiner

HIGH-POWER ELECTROMAGNETIC ASSEMBLY

CROSS-REFERENCE TO RELATED APPLICATIONS

This application claims benefits of Chinese Patent Application No. 201210411821.5, filed on Oct. 25, 2012 in the State Intellectual Property Office of China, the disclosure of which is incorporated herein by reference in its entirety.

TECHNICAL FIELD

The present disclosure relates to a high-power electromagnetic assembly, especially to a high-power electromagnetic assembly having good cooling effect.

BACKGROUND

The electromagnetic assembly is a key component in the power electronic system. The high-power reactor and transformer have been widely used in the power compensation, the power quality improvement, the frequency control, and the power equipment such as wind power and solar inverter. The electromagnetic assembly has the main function of isolating, limiting short-circuit current, var compensation, and smoothing wave.

In the operating period, the electromagnetic assembly will consume some power, which is converted into heat. The cooling to the electromagnetic assembly is required for the normal operation thereof. The common methods for cooling the electromagnetic assemblies are divided into the air-cooling mode and the liquid-cooling mode, and the electromagnetic assembly is correspondingly divided into the air-cooling electromagnetic assembly and the liquid-cooling electromagnetic assembly.

In the liquid-cooling electromagnetic assembly, the liquid-cooling plate is provided in a specific position, and the heat is removed through the circular flow of the liquid inside the liquid-cooling plate. In the liquid-cooling mode, the circular liquid tank, the circular pump, the heat exchanger and the connecting pipe are required outside the liquid-cooling plate. At the same time, a plurality of connectors in the liquid-circulation loop may tend to shorten the system life or damage the personal safety due to leakage. Thus, the entire cooling system has the disadvantages of structure complexity, large volume, high energy consumption, low reliability, high cost and so on. Further, the liquid-cooling plate is arranged between the adjacent layers of the coil and between the coil and the iron core, where a strong alternating magnetic field often exists, this may cause the eddy current loss in the liquid-cooling plate itself, resulting in additional loss, and reducing the efficiency of the electromagnetic assembly.

In the air-cooling electromagnetic assembly such as reactor or transformer, the insulated supports are provided between the iron core and coil, between the coil layers or inside the coil to define the air channel. The cold air enters from one end of the air channel and moves along the axial direction of the coil, and is transformed into the hot air through the heat exchange with the wall surface of the air channel. After that, the hot air is blown from the other end of the air channel to achieve the cooling of the electromagnetic assembly. The air-cooling mode has disadvantages that the heat exchange coefficient is low, the heat exchange area is difficult to enlarge due to dependence on the air channel surface area, and the cooling efficiency thus is low. In many cases, the conventional cooling method is unable to meet the cooling demand of the high-power electromagnetic assembly. The size and cost of the electromagnetic assembly often have to increase to meet the cooling demand.

Accordingly, it is desired to develop a high-power electromagnetic assembly of low cost and high cooling efficiency.

SUMMARY

Further scope of applicability of the present disclosure will become apparent from the detailed description given hereinafter. However, it should be understood that the detailed description and specific examples, while indicating preferred embodiments of the disclosure, are given by way of illustration only, since various changes and modifications within the spirit and scope of the invention will become apparent to those skilled in the art from the following detailed description.

According to an aspect of the disclosure, a high-power electromagnetic assembly comprises a coil having at least two coil layers, wherein a heat sink is provided between adjacent coil layers of the coil to aid dissipating heat from the coil.

For example, the heat sink is in close contact with at least one of the adjacent coil layers.

For example, an insulating layer is provided between the heat sink and at least one of the adjacent coil layers.

For example, a longitudinal direction of an air channel of the heat sink is substantially consistent with an axial direction of the coil.

For example, opposite ends of the heat sink are level with opposite ends of the coil, respectively; or one of opposite ends of the heat sink is level with one of opposite ends of the coil, and the other of opposite ends of the coil is beyond the other of opposite ends of the heat sink; or opposite ends of the coil are beyond opposite ends of the heat sink respectively.

According to another aspect of the disclosure, a high-power electromagnetic assembly comprises an iron core and a coil winding around the iron core having at least one coil layer, wherein a heat sink is provided between the iron core and an adjacent coil layer and/or between two adjacent coil layers if there are at least two coil layers to aid the coil in dissipating heat from the coil and/or the iron core.

For example, the heat sink is in close contact with at least one of the iron core and the adjacent coil layer, and/or the heat sink is in close contact with at least one of adjacent coil layers.

For example, an insulating layer is provided between the heat sink and at least one of the iron core and the adjacent coil layer, and/or an insulating layer is provided between the heat sink and at least one of adjacent coil layers.

For example, a longitudinal direction of an air channel of the heat sink is substantially consistent with an axial direction of the coil.

For example, opposite ends of the heat sink are level with opposite ends of the coil; or one of opposite ends of the heat sink is level with one of opposite ends of the coil, and the other of the opposite ends of the coil is beyond the other of the opposite ends of the heat sink; or opposite ends of the coil are beyond opposite ends of the heat sink, respectively.

For example, a space enclosed by the iron core is referred to as an inner space of the iron core, and opposite ends of the coil are respectively beyond opposite ends of the heat sink in the inner space of the iron core.

For example, an air gap is provided at a middle portion of the iron core wound around by the coil, the heat sinks are provided between the air gap and one of opposite ends of the coil and between the air gap and the other of opposite ends of the coil, and a distance between two heat sinks on both sides of the air gap is larger than that the air gap of the iron core.

According to still another aspect of the invention, a high-power electromagnetic assembly comprises a coil having at least two coil layers, or comprises an iron core and a coil winding around the iron core, wherein a heat sink is provided between two adjacent coil layers and/or between the iron core and an adjacent coil layer, wherein the heat sink comprises a first panel, a second panel and multiple supporting structures in connection with the first and second panels, and the first panel, the second panel and the supporting structures together constitute multiple air channels for cooling airflows passing therethrough.

For example, at least some of the air channels are provided with openings, and no conductive loop is formed on a cross section perpendicular to an airflow direction of the air channels having the openings.

For example, the openings are defined on the first panel and/or the second panel.

For example, the first panel and/or the second panel are/is in close contact with the iron core or the coil layer to close the openings.

For example, each air channel is provided with an opening, adjacent openings of the air channels are defined on the first panel and the second panel respectively, and the openings on the first panel alternate with those on the second panel.

For example, a total area of all openings on the first panel is less than 50% of an area of the first panel, and a total area of all openings on the second panel is less than 50% of an area of the second panel.

For example, each air channel is provided with an opening, and all of the openings are defined on the first panel or the second panel.

For example, the first panel is parallel to the second panel.

For example, both the first panel and the second panel are flat shaped or arc-plate shaped.

For example, the first panel, the second panel and the supporting structures are made of metal material.

For example, the cross section of the air channel has a rectangular shape, a triangular shape, a trapezoidal shape, a circular shape or an oval shape.

For example, each air channel is provided with at least one fin.

For example, the fin is parallel to the air channel or has a spiral shape.

For example, each opening is provided with an insulating seal.

For example, the heat sink further comprises a middle substrate between the first panel and the second panel, the multiple supporting structures being in connection with the first panel and the middle substrate and in connection with the second panel and the middle substrate respectively, two layers of multiple air channels for the airflow passing through being defined by the first panel, the middle substrate and the supporting structures, and by the second panel, the middle substrate and the supporting structures respectively.

For example, at least some of the air channels are provided with openings, and no conductive loop is formed on a cross section perpendicular to an airflow direction of the air channels having the openings.

For example, the openings are defined on the first panel and/or the second panel.

For example, the first panel, the second panel and the middle substrate are parallel to each other.

For example, the first panel, the second panel and the middle substrate are made of metal material.

For example, the cross section of each air channel has a rectangular shape, a triangular shape, a trapezoidal shape, a circular shape or an oval shape.

For example, the air channel is provided with at least one fin.

For example, the fin is parallel to the air channel or has a spiral shape.

For example, each opening is provided with an insulating seal.

For example, the heat sink comprises an heat sink body and multiple air channels defined in the heat sink body, the air channel comprising multiple air channel portions having an identical opening direction, wherein adjacent air channel portions partially offset each other, and overlapping portions communicate with each other for airflow passing therethrough.

For example, the cross section of each air channel has a U-shape, a triangular shape with an opening, a semi-circular shape, or a trapezoidal shape with an opening.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION

The embodiments of the invention are thus described; it will be obvious that the same may be varied in many ways. Such variations are not to be regarded as a departure from the spirit and scope of the invention, and all such modifications as would be obvious to those skilled in the art are intended to be included within the scope of the following claims.

The heat sink in the present disclosure is referred to as the radiator using air as the cooling medium. The design concept of the present disclosure is that the heat sink is employed in the high-power electromagnetic assembly for dissipating heat by means of air, and thereby the high-power electromagnetic assembly has simple structure, reliable safety, and convenient manufacturing process, low cost and good cooling effect. The high-power electromagnetic assembly may be a reactor or a transformer, such as an air-core reactor, an iron-core reactor or an iron-core transformer or the like. The reactor and the transformer can be divided into single-phase and triple-phase and the like. The reactor mentioned below can be taken place by the transformer.

First Embodiment

Figure 1:
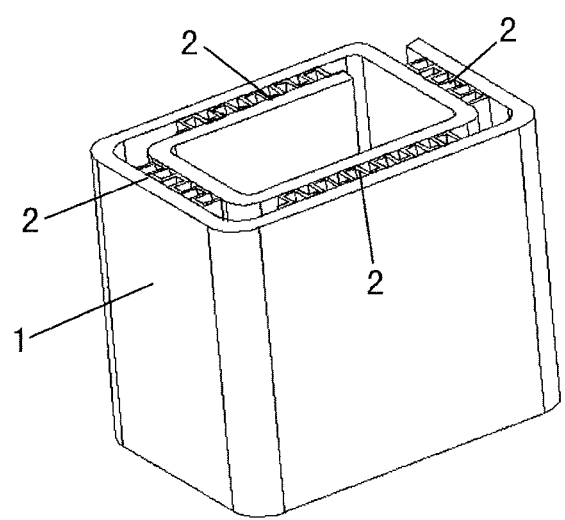
FIG. 1 is a perspective schematic view of the first embodiment of the high-power electromagnetic assembly in the present disclosure.

Referring to FIG. 1, the high-power electromagnetic assembly in the first embodiment of the present disclosure is an air-core reactor including a coil 1, in which the center of the coil 1 is hollow, i.e., there is no iron core in the center of the coil. The coil 1 includes a number of coil layers. Only two coil layers are shown in FIG. 1, and a heat sink 2 is sandwiched between two coil layers to help the coil 1 to remove the heat. In fact, the number of layers of the coil 1 is not limited to two, and the coil 1 may include two or more layers. In this case, the heat sink 2 may be arranged between adjacent layers to improve cooling efficiency.

An insulation layer (not shown in figure) is provided between the heat sink 2 and at least one layer of two adjacent coil layers. The heat sink 2 is in close contact with two adjacent coil layers or with only one layer thereof, for transferring heat of the coil layer to the heat sink 2 and achieving the rapid cooling effect.

The longitudinal direction of the air channel in the heat sink 2 is substantially consistent with the axial direction of the coil 1. The axial direction of the coil 1 is substantially perpendicular to the winding direction of the coil 1. The term "substantially" is used to mean any slight change in the relationship, for example, the slight change caused by manufacturing error or assembly precision, which does not alter the nature thereof. Opposite ends of the heat sink 2 is level with opposite ends of the coil 1 respectively. The disclosure is not limited thereto. In other embodiments, one of opposite ends of the heat sink 2 is level with one of opposite ends of the coil 1, and the other end of the coil 1 is beyond the other end of the heat sink 2. Alternatively, opposite ends of the coil 1 are beyond opposite ends of the heat sink 2.

Second Embodiment

Figure 2:
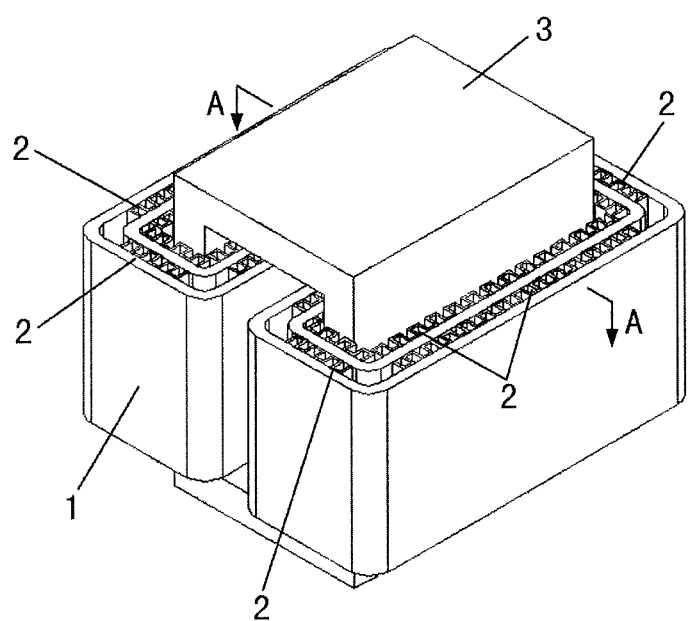
FIG. 2 is a perspective schematic view of the second embodiment of the high-power electromagnetic assembly in the present disclosure.
Figure 3:
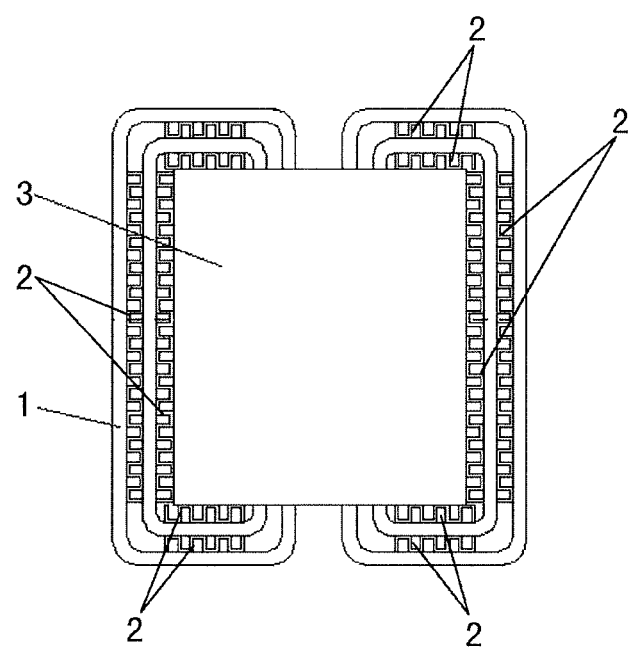
FIG. 3 is a top view of the high-power electromagnetic assembly shown in FIG. 2.
Figure 4:
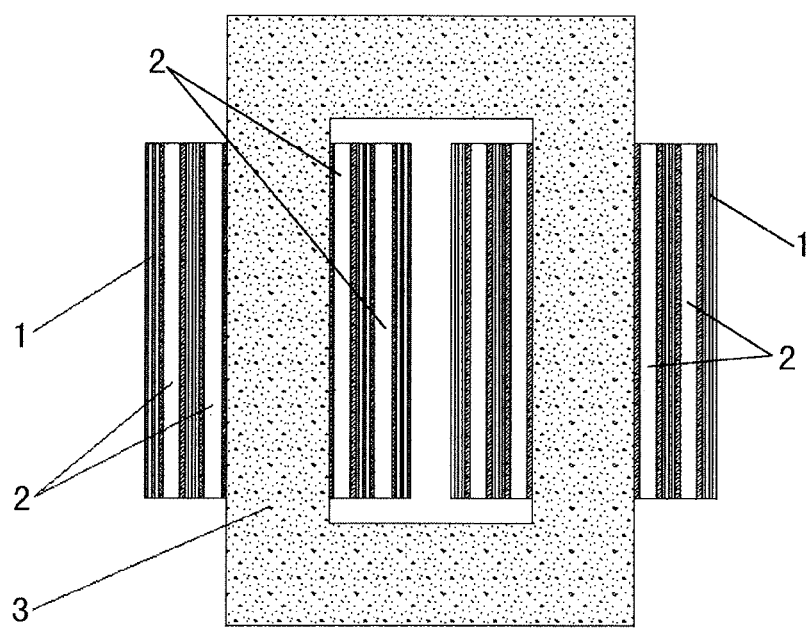
FIG. 4 is a section view of the high-power electromagnetic assembly along A-A line shown in FIG. 2.

Referring to FIGS. 2, 3 and 4, the high-power electromagnetic assembly in the second embodiment of the present disclosure is a single-phase iron core reactor including the coil 1 and the iron core 3. Two coils 1 wind around opposite core columns of the iron core 3 respectively. Each coil 1 includes a number of coil layers, and only two coil layers are shown in FIG. 2. A heat sink 2 is sandwiched between two coil layers and between the iron core 3 and the adjacent coil layer respectively to help the iron core 3 and the coil 1 to remove heat. Alternatively, the heat sink 2 is sandwiched only between two coil layers or only between the iron core 3 and the adjacent coil layer. The insulation layer is provided between the heat sink 2 positioned between two coil layers and two coil layers respectively, or only between the heat sink 2 and one coil layer. Similarly, an insulation layer is provided between the heat sink 2 positioned between the iron core 3 and the coil layer and the iron core 3 and/or the coil layer. In order to further improve the cooling efficiency, the heat sink 2 may be in close contact with the adjacent coil layer and/or the iron core 3, for quickly transferring the heat of the coil or the iron core 3 to the heat sink 2 through the respective close contact surfaces. The longitudinal direction of the air channel in the heat sink 2 is substantially consistent with the axial direction of the coil 1.

In the second embodiment, the iron core 3 is frame-shaped, the enclosed space by the iron core 3 is the inside of the iron core 3, and the unenclosed space by the iron core 3 is the outside of the iron core 3. Opposite ends of the heat sink 2 in the inside or outside of the iron core 3 are level with opposite ends of the coil 1. However, the disclosure is not limited thereto. For example, one of opposite ends of the heat sink 2 is level with one of opposite ends of the coil 1, and the other end of the coil 1 is beyond the other end of the heat sink 2.

Third Embodiment

Figure 5:
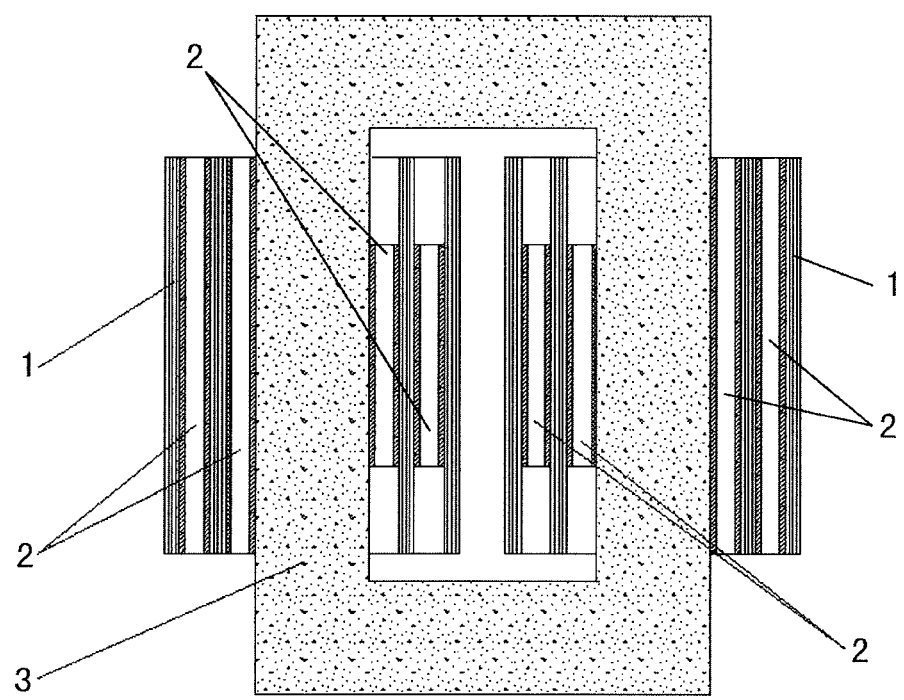
FIG. 5 is a section view of the third embodiment of the high-power electromagnetic assembly in the present disclosure.

Referring to FIG. 5, the difference between the high-power electromagnetic assembly of the third embodiment and that of the second embodiment of the present disclosure is that opposite ends of the heat sink 2 in the inside of the iron core 3 are within opposite ends of the coil 1. However, opposite ends of the heat sink 2 in the outside of the iron core 3 are level with opposite ends of the coil 1, which may significantly reduce eddy current loss of the heat sink caused by the alternating magnetic field.

The other part of the high-power electromagnetic assembly in the third embodiment has the same structure as that of the second embodiment and the detailed description thereof is omitted herein.

Forth Embodiment

Figure 6:
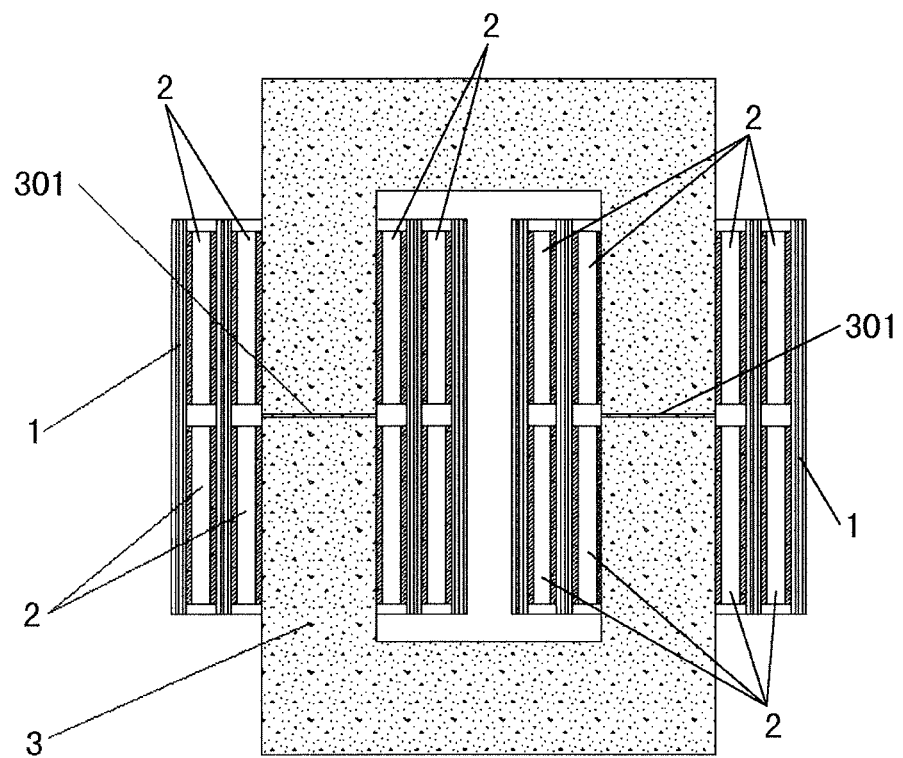
FIG. 6 is a section view of the forth embodiment of the high-power electromagnetic assembly in the present disclosure.

Referring to FIG. 6, the difference between the high-power electromagnetic assembly of the forth embodiment and that of the second embodiment in the present disclosure is that the air gaps 301 are provided at the middle portion of the iron core 3 wound by the coil 1. The heat sink 2 is provided between the air gap and one of opposite ends of the coil 1 and between the air gap and the other of opposite ends of the coil 1, i.e., the heat sink 2 are divided into two parts for arrangement. The distance between the two parts is larger than the air gap of the iron core, which may significantly reduce eddy current loss of the heat sink caused by the alternating magnetic field.

The other part of the high-power electromagnetic assembly in the forth embodiment has the same structure as that of the second embodiment and the detailed description thereof is omitted herein.

A variety of heat sinks suitable for the high-power electromagnetic assembly of the present disclosure are illustrated in the following.

First Heat Sink

Figure 7A:
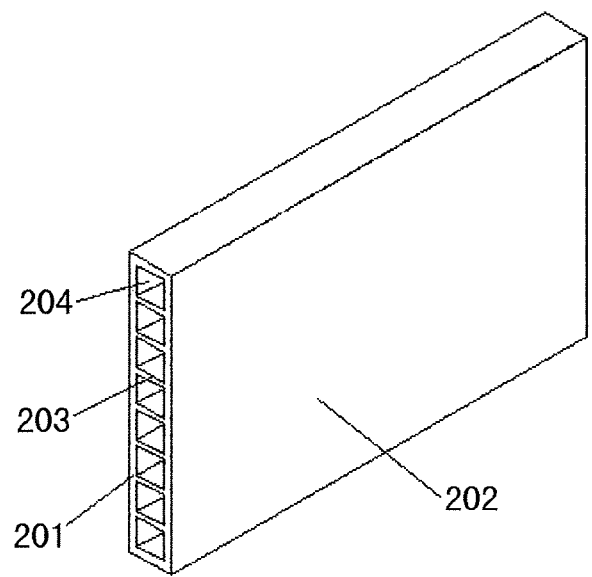
FIG. 7A is a perspective schematic view of the first heat sink of the high-power electromagnetic assembly in the present disclosure.
Figure 7B:
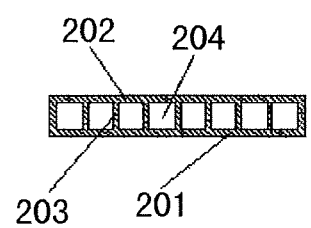
FIG. 7B is a section view of the first heat sink shown in FIG. 7A.

Referring to FIGS. 7A and 7B, the first heat sink of the present high-power electromagnetic assembly is a sing-layer multi-channel flat heat sink including a first panel 201, a second panel 202 and multiple supporting structure 203 (e.g., separator) in connection with the first panel 201 and the second panel 202. The first panel 201, the second panel 202 and multiple supporting structures 203 constitute multiple air channels 204 for the cooling airflow passing through. The first panel 201, the second panel 202 and the supporting structure 203 are made of, for example, a good thermal conductive material such as a metallic material. For example, the first panel 201, the second panel 202 and the supporting structure 203 are made of copper, aluminum, or aluminum alloy. In the first heat sink, the first panel 201 and the second panel 202 are parallel to each other and are flat-shaped. The supporting structure 203 is also plate-shaped. Thereby the medium channel 204 is rectangular. The first panel 201 and the second panel 202 are unnecessary to be parallel to each other, and may form an angle with each other. The first panel 201 and the second panel 202 are not limited to the flat shape, but may have other shapes such as the arc-plate shape. Accordingly, the air channel may have a variety of cross-sectional shapes, such as triangular shape, circular shape, oval shape, trapezoid shape and irregular shape. The medium channel may have any cross-sectional shape, as long as the airflow (e.g., air) may enter into one end and flow out of the other end of the medium channel. Multiple air channels 204 of the heat sink 2 multiplies the heat exchange area between the airflow and the heat sink, so as to enhance the cooling capability of high-power electromagnetic assembly (e.g., reactor or transformer) and to improve the reliability of high-power electromagnetic assembly.

After the first heat sink is mounted to the present high-power electromagnetic assembly, the heat generated from the coil 1 or the iron core 3 is transmitted to the heat sink, the cool air enters from one end of the air channel 204 and flows out of the other end thereof after fully heat exchange with the inner surface of the air channel 204, removing heat and cooling the coil 1 and the iron core 3.

Second Heat Sink

Figure 8A:
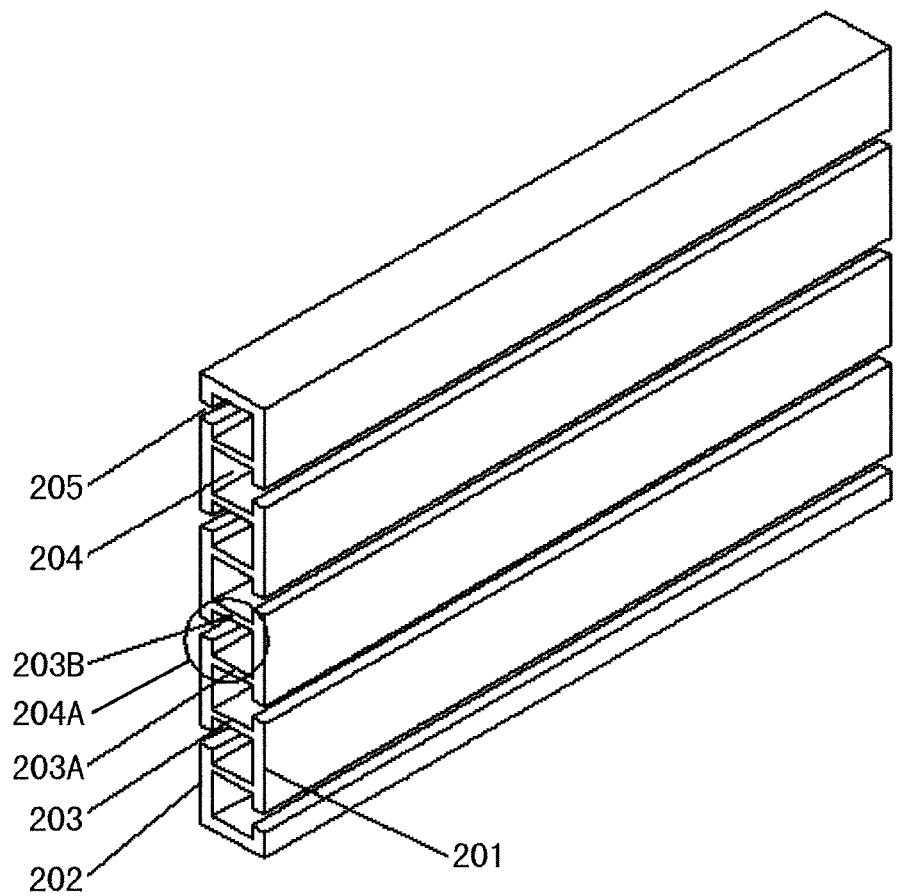
FIG. 8A is a perspective schematic view of the second heat sink of the high-power electromagnetic assembly in the present disclosure.
Figure 8B:
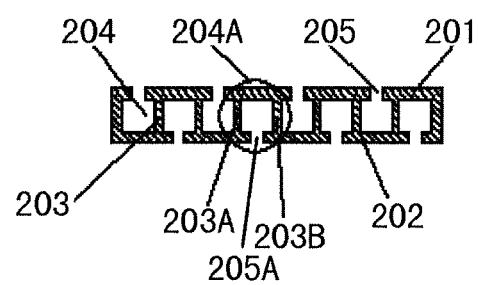
FIG. 8B is a section view of the second heat sink shown in FIG. 8A.

Referring to FIGS. 8A and 8B, the second heat sink of the present high-power electromagnetic assembly is a double-side-open type multi-channel flat heat sink. The difference of the second heat sink from the first one is that a opening 205 is defined in each air channel 204 along its longitudinal direction (air flowing direction), preventing the current loop from forming in the heat sink due to the alternating electrical field during the operation of the high-power electromagnetic assembly. Multiple openings 205 are respectively defined in multiple air channels. In the second heat sink, multiple openings 205 are uniformly arranged on the first panel 201 and the second panel 202. The openings 205 on the first panel 201 alternate with that on the second panel 202, i.e., two openings 205 of two adjacent air channels 204 are defined on the first panel 201 and the second panel 202 respectively. In detail, the opening 205 of the first air channel 204 is defined on the first panel 201, the opening 205 of the second air channel 204 is defined on the second panel 201, and the opening 205 of the third air channel 204 is defined on the first panel 201, and so on. The opening 205 is defined so that the cross section of the air channel perpendicular to the airflow direction is not close, thereby forming the open current. For example, as shown in FIGS. 8A and 8B, the forth medium channel 204A is surrounded by the forth supporting structure 203A, the fifth supporting structure 203B, the first panel 201, and the second panel 202. The forth opening 205A is defined on the second panel 202 and extends along the longitudinal direction (substantially consistent with the airflow direction) and over the full length of the forth air channel 204A. Therefore, each lateral cross section perpendicular to the longitudinal direction of the forth air channel 204A is provided with the forth openings 205A. In this case, the end-to-end connection of the forth supporting structure 203A, the first panel 201, the fifth supporting structure 203B, and the second panel 202 on the lateral cross section is broken by the forth opening 205A without forming a conductive loop.

When being mounted, the first panel 201 and the second panel 202 of the heat sink are in close contact with the coil layer and the iron core of the high-power electromagnetic assembly respectively to constitute the thermal interface, or the first panel 201 and the second panel 202 of the heat sink are in close contact with the adjacent coil layers of the high-power electromagnetic assembly respectively to constitute the thermal interface. At the same time, the opening 205 of the air channels 204 are sealed by the coil layer in close contact with the first panel 201 or the iron core in close contact with the second panel 202, thereby constituting the independent air channel 204 with closed sidewall and the inner surface thereof is used for a heat exchange surface. It should be noted that the first panel 201 and the second panel 202 of the heat sink are in close contact with the coil layer and the iron core respectively through an insulation layer, or the first panel 201 and the second panel 202 of the heat sink are in close contact with the adjacent coil layers respectively through the insulation layer. A large quantity of heat is generated from the coil and the iron core during the operation of the high-power electromagnetic assembly. The heat is transmitted from the coil layer and/or the iron core to the first panel 201 and/or the second panel 202 and the supporting structures 203, i.e., to the surface of the air channel 204. The cool air enters into one end of multiple independent air channels 204, flows through the air channel 204 and exchanges heat with the surface of the air channel 204, flows out from the other end of the air channel 204 and takes away a lot of heat for the purpose of cooling the high-power electromagnetic assembly. In addition, when being mounted, the first panel 201 and the second panel 202 of the heat sink 2 is unnecessarily in close contact with the coil layer and/or the iron core of the high-power electromagnetic assembly respectively. In this case, the opening of the air channel 204 is not closed, but the coil layer and/or the iron core may still act as a block wall, so that the airflow enters from one end of the air channel 204 and flows out from the other end thereof to take away the heat.

Furthermore, in order to achieve a large contact area between the first panel 201 or the second panel 202 of the second heat sink and the coil layer or the iron core, total area of all openings 205 on the first panel 201 is less than 50% of the area of the first panel 201, and total area of all openings 205 on the second panel 202 is less than 50% of the area of the second panel 202.

The purpose of defining opening 205 at the air channel 204 is to make it impossible to form the closed current loop at the air channel 204 of the heat sink under the induction voltage of the alternating magnetic field, thereby significantly reducing the eddy current loss caused by electromagnetic induction. The second heat sink is employed to a single-phase iron core reactor, total area of the opening 205 on the first panel 201 of the heat sink is equal to 40% of the area of the first panel 201, and total area of the opening 205 on the second panel 202 of the heat sink is equal to 40% of the area of the second panel 202. In this case, the finite element simulation on 350 Hz seventh harmonic wave leads to conclusion that the eddy current loss of the double-side-open type multi-channel radiator of the second heat sink is less than 10% of total loss of the single-phase iron core reactor, and is much less than that of the single-phase iron core reactor without the opening.

In the second heat sink mentioned above, each air channel is provided with an opening. In fact, it is feasible that a one part of air channels are provided with the openings and the other part of the air channels are not provided with the openings. On the basis of ensuring a good cooling effect, the generated eddy current loss is reduced greatly.

The other part of the structure of the second heat sink is the same as that of the first heat sink, and the detailed description thereof is omitted herein.

Third Heat Sink

Figure 9A:
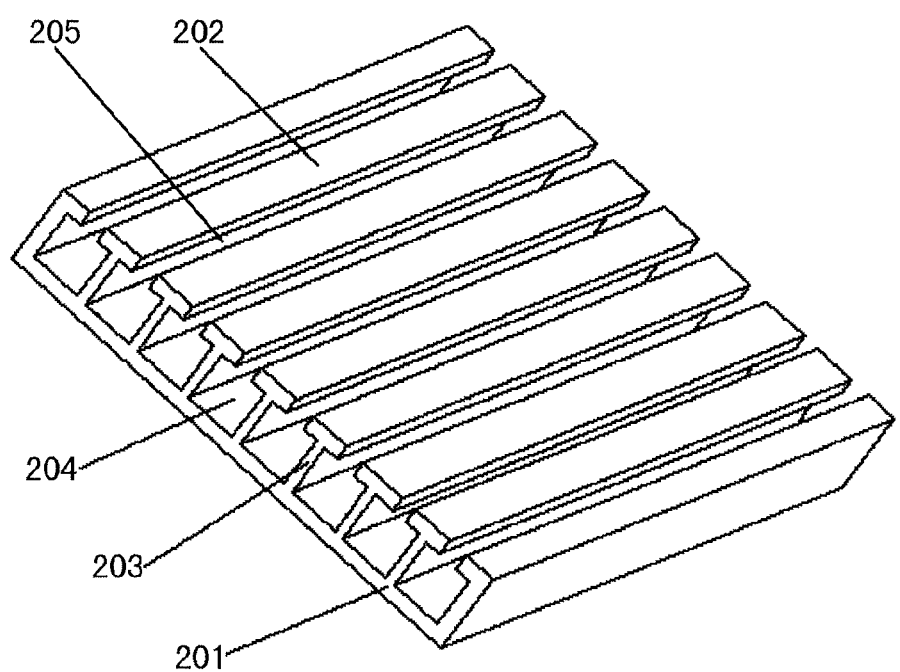
FIG. 9A is a perspective schematic view of the third heat sink of the high-power electromagnetic assembly in the present disclosure.
Figure 9B:
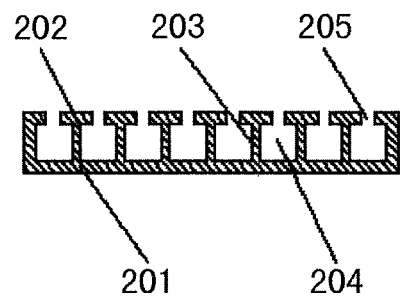
FIG. 9B is a section view of the third heat sink shown in FIG. 9A.

Referring to FIGS. 9A and 9B, the third heat sink of the high-power electromagnetic assembly is a single-side-open type of multi-channel flat heat sink. It differs from the second heat sink in that all the openings 205 of the air-channel 204 are defined on the second panel 202 and no opening is defined on the first panel 201. Without a doubt, it is feasible that all the openings 205 may be defined on the first panel 201 and no opening is defined on the second panel 202.

The other part of the structure of the third heat sink is the same as that of the second heat sink, and the detailed description thereof is omitted herein.

Forth Heat Sink

Figure 10A:
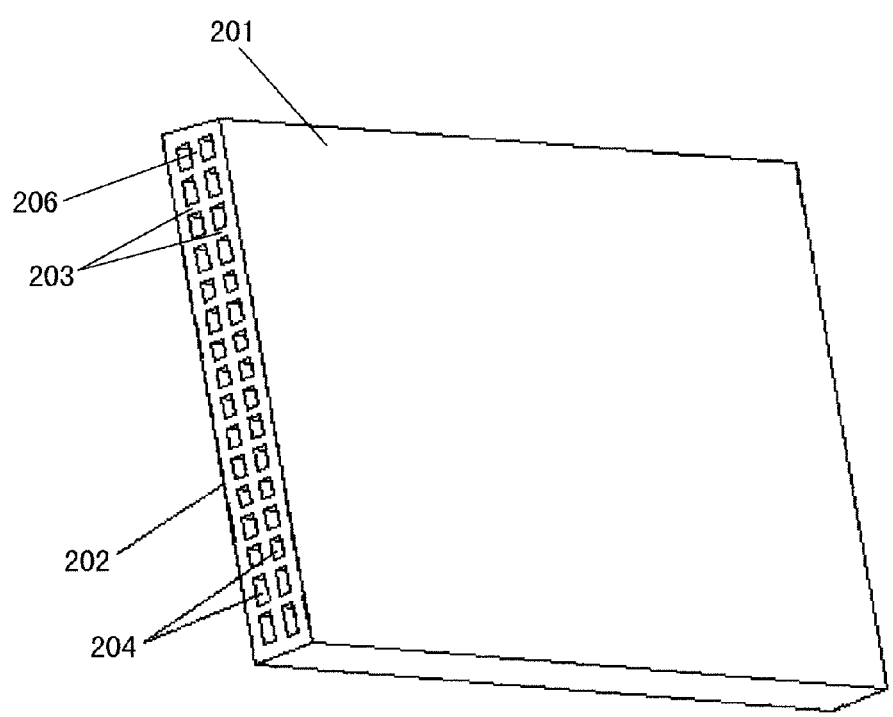
FIG. 10A is a perspective schematic view of the forth heat sink of the high-power electromagnetic assembly in the present disclosure.
Figure 10B:
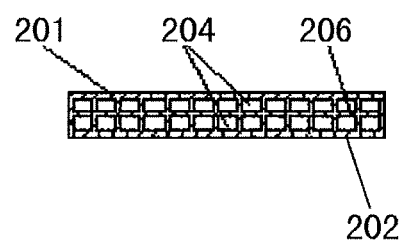
FIG. 10B is a section view of the forth heat sink shown in FIG. 10A.

Referring to FIGS. 10A and 10B, the forth heat sink of the present high-power electromagnetic assembly is a double-layer multi-channel flat heat sink including a first panel 201, a second panel 202, a middle substrate 206, multiple supporting structures 203 in connection with the first panel 201 and the middle substrate 206 or in connection with the second panel 202 and the middle substrate 206. The first panel 201, the middle substrate 206 and the supporting structures 203 together constitute multiple air channels 204 as the first-layer air channels. The second panel 202, the middle substrate 206 and the supporting structures 203 together constitute multiple air channels 204 as the second-layer air channel. The first-layer air channel and the second air channel share one middle substrate 206, thereby forming a double-layer multi-channel flat heat sink with two-layer air channel.

In the multi-layer multi-channel heat sink of the forth heat sink, the parts of structures of the first-layer air channel and the second-layer channel are similar to that of the single-layer type of multi-channel flat heat sink as shown in FIGS. 7A and 7B. Therefore, the forth multi-layer multi-channel heat sink can be approximately regarded as two sing-layer type of multi-channel flat heat sinks of the first heat sink type, which are back-to-back laminated together and share one middle substrate.

The other parts of the multi-layer multi-channel heat sink of the forth heat sink, such as the shape of the cross section of air channel 204 of each layer, are the same as that of the first heat sink. The detailed description thereof is thus omitted herein. The multi-layer multi-channel heat sink of the forth heat sink has larger exchange area and better cooling effect due to having two layers of air channels.

Fifth Heat Sink

Figure 11A:
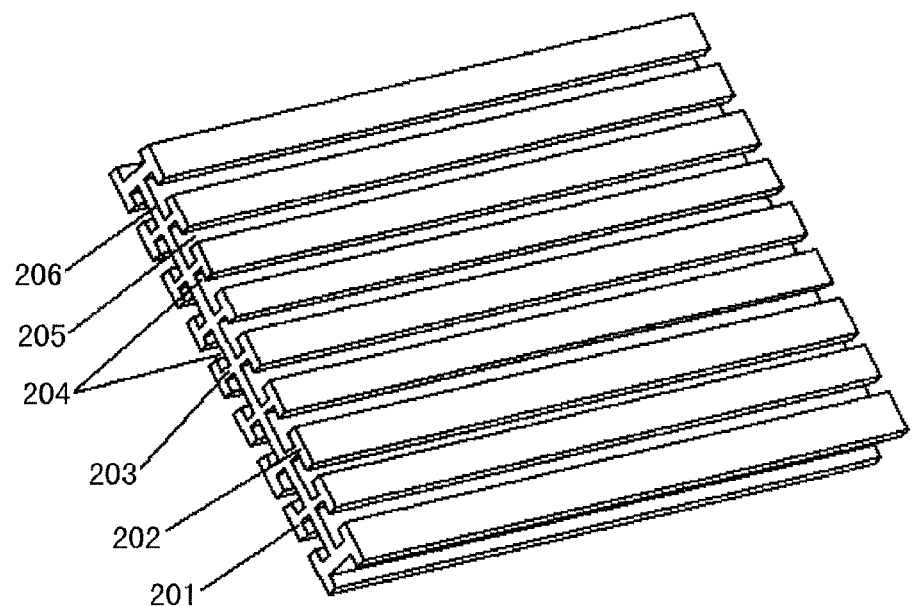
FIG. 11A is a perspective schematic view of the fifth heat sink of the high-power electromagnetic assembly in the present disclosure.
Figure 11B:
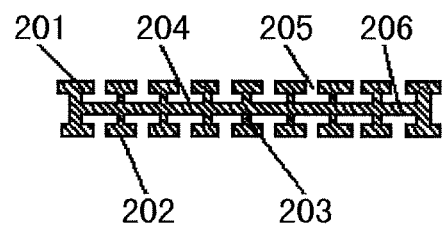
FIG. 11B is a section view of the fifth heat sink shown in FIG. 11A.

Referring to FIGS. 11A and 11B, the fifth heat sink of the present high-power electromagnetic assembly is a double-side-open type of multi-layer multi-channel flat heat sink, which differs from the forth multi-layer multi-channel flat heat sink in that the openings 205 are defined at each air channel 204 in the first-layer air channel and on the first panel 201 and in the second-layer air channel and on the second panel 201.

In the fifth heat sink, the openings 205 at each air channel 204 in the first-layer and second-layer air channels are arranged corresponding to each other. However, the disclosure is not limited thereto. The openings 205 at each air channel 204 in the two layers of air channel are offset with respect to each other. The first panel 201, the second panel 202 and the middle substrate 206 may be parallel to one another or not parallel to each other. The shapes thereof may be flat or arc-plate, and so on. The first panel 201, the second panel 202 and the middle substrate 206 are, for example, made of material having good thermal conductivity like metal. For example, they may be made of copper, aluminum or aluminum alloy.

Still further, the total area of all opening 205 on the first panel 201 is less than 50% of the area of the first panel 201, the total area of all opening 205 on the second panel 202 is less than 50% of the area of the second panel 202, in order to maintain the first panel 201 and the second panel 202 to the utmost extent and increase the heat exchange area.

The other part of the structure of the fifth heat sink is the same as that of the forth heat sink. The installation of the fifth heat sink is similar to that of the second heat sink in closing the opening 205 of the air channel 204 with the coil or the iron core to form the independent air channel, but the disclosure is not limited thereto.

Sixth Heat Sink

Figure 12A:
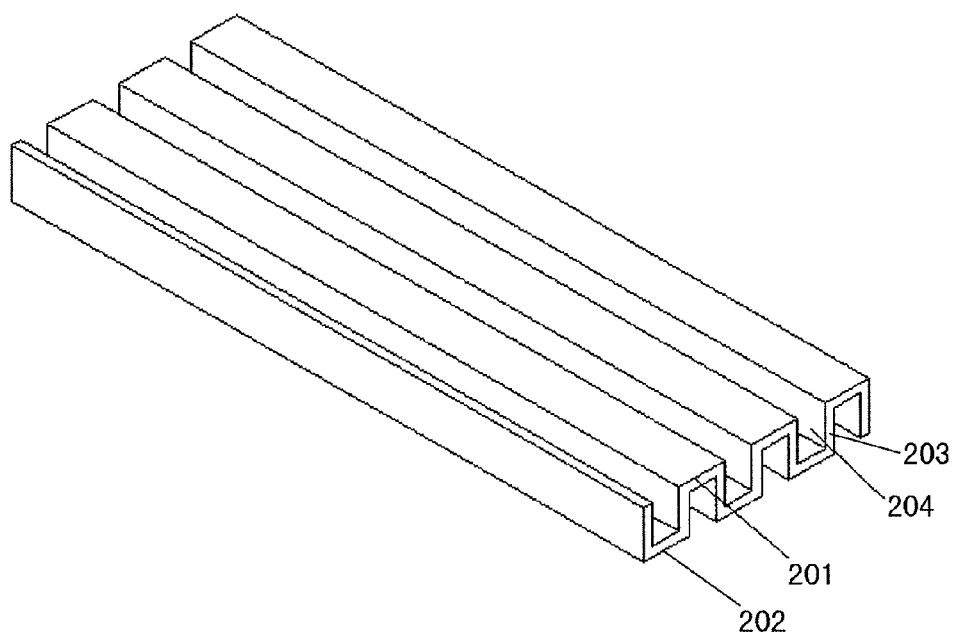
FIG. 12A is a perspective schematic view of the sixth heat sink of the high-power electromagnetic assembly in the present disclosure.
Figure 12B:
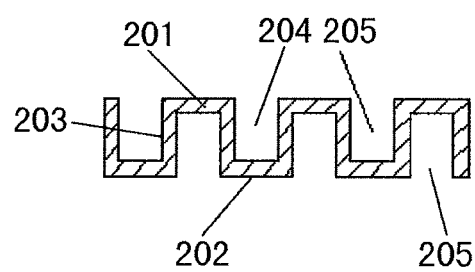
FIG. 12B is a section view of the sixth heat sink shown in FIG. 12A.

Referring to FIGS. 12A and 12B, the sixth heat sink of the present high-power electromagnetic assembly is a punch-forming multi-channel flat radiator including a first panel 201, a second panel 202 and multiple supporting structures 203 in connection with the first panel 201 and the second panel 203. The supporting structure 203, the first panel 201 and the second panel 202 together constitute multiple air channels 204. An opening 205 is defined at each air channel, the opening 205 of two adjacent air channels 204 are defined on the first panel 201 and the second panel 202 respectively, and the openings 205 on the first panel 201 and the second panel 202 alternate with each other. The air channel 204 is U-shaped, total area of the opening 205 on the first panel 201 is less than 50% of the area of the first panel 201, and total area of the opening 205 on the second panel 202 is less than 50% of the area of the second panel 202.

For example, the sixth heat sink is made from the plate of copper, aluminum or aluminum alloy by means of punch forming process using a mold or by repeating bending process. Therefore, the first panel 201, the second panel 202 and the supporting structure 203 have the substantially same thickness and may be made relatively thin, thereby reducing the weight and saving the cost. Of course, the material for the sixth heat sink is not limited to copper, aluminum or aluminum alloy, and other materials of good thermal conductivity, which can be bended or molded easily, are feasible.

The other part of the structure of the sixth heat sink is the same as that of the second heat sink, and the detailed description is omitted herein.

Seventh Heat Sink

Figure 13A:
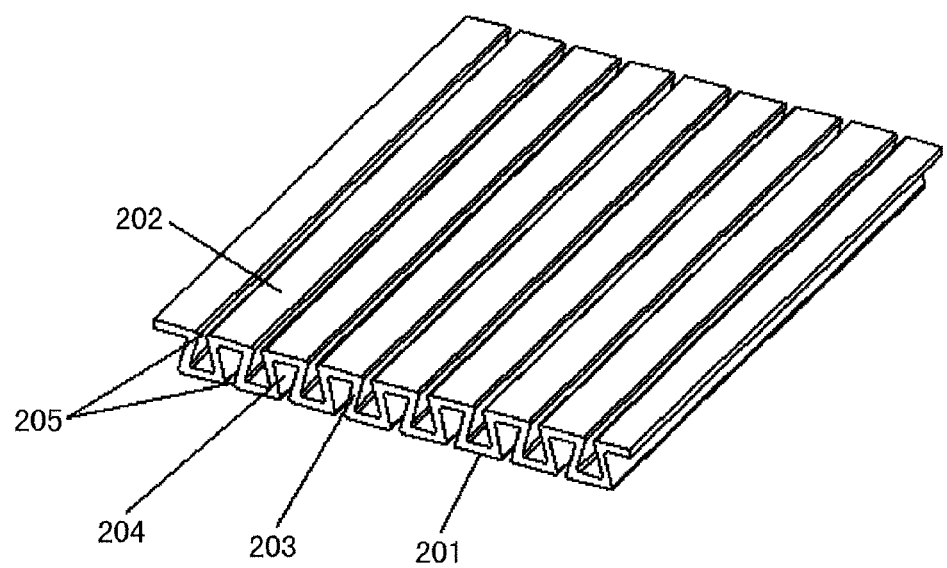
FIG. 13A is a perspective schematic view of the seventh heat sink of the high-power electromagnetic assembly in the present disclosure.
Figure 13B:
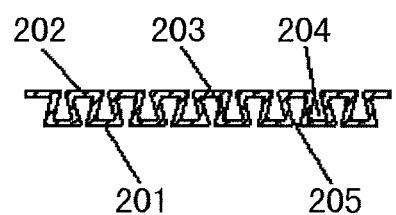
FIG. 13B is a section view of the seventh heat sink shown in FIG. 13A.

Referring to FIGS. 13A and 13B, the difference between the seventh heat sink and sixth heat sink in the present high-power electromagnetic assembly is that the air channel 204 has a trapezoidal, total area of all opening 205 on the first panel 201 is less than 50% of the area of the first panel 201, and total area of all opening 205 on the second panel 202 is less than 50% of the area of the second panel 202. The air channel 204 may also be other shapes such as a triangular shape, a circular shape or an oval shape.

The other part of the structure of the seventh heat sink is the same as that of the sixth heat sink, and the detailed description thereof is omitted herein.

Eighth Heat Sink

Figure 14A:
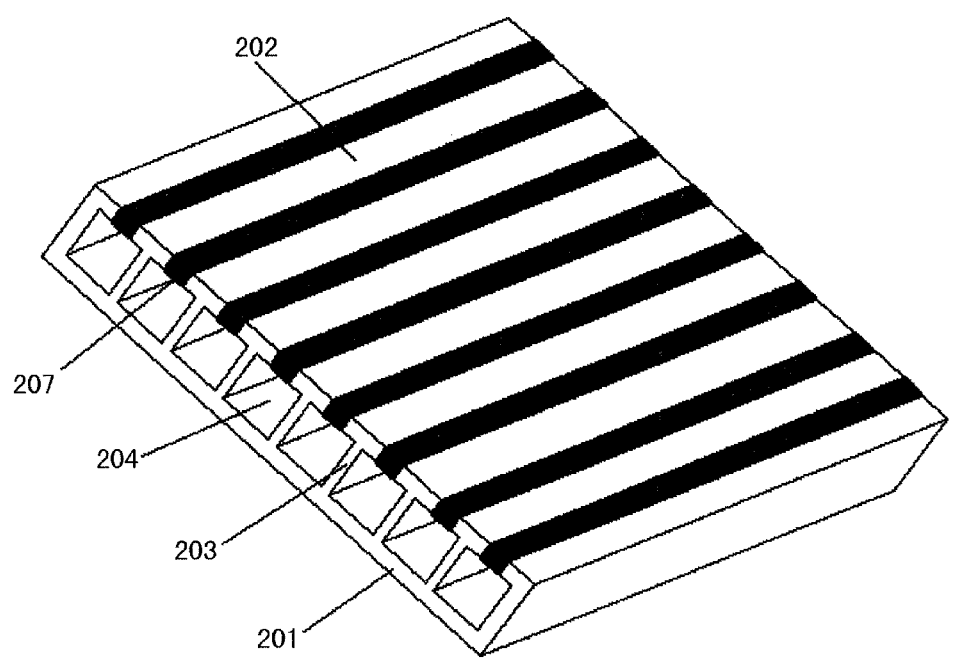
FIG. 14A is a perspective schematic view of the eighth heat sink of the high-power electromagnetic assembly in the present disclosure.
Figure 14B:
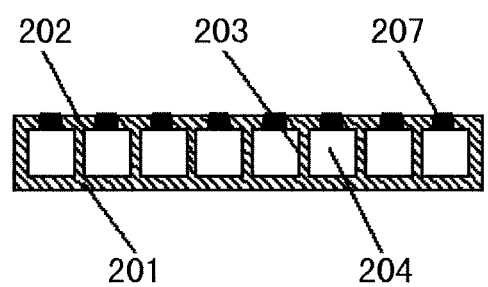
FIG. 14B is a section view of the eighth heat sink shown in FIG. 14A.

Referring to FIGS. 14A and 14B, the difference between the eighth heat sink and the third heat sink of the present high-power electromagnetic assembly is that the opening 205 of each air channel 204 is filled with or installed with an insulated seal 207. The insulated seal 207 may be made of a homogenous material such as resin different from the material of the radiator itself, or composite material of a variety of materials such as metals and insulating materials (as long as the insulating material exists between the metal, which may be the same as or different from the material of the radiator, and the radiator to avoid an electrical connection). In practice, the openings 205 of a part of the air channels 204 may be provided with the insulating seals 207, but the openings 205 of other part of the air channels 204 may not be provided with the insulating seal 207.

In the eighth heat sink, since the insulated seal 207 as a whole is not conductive, the conductive loop cannot be formed at any cross section perpendicular to the airflow direction of the air channel 204 having the insulating seal 207. Thus, the eddy current loss is reduced when the heat sink is applied to the high-power electromagnetic assembly. Meanwhile, the air channel 204 having the insulating seal 207 may define a sidewall-closed channel by itself, and there is no need to block the opening 205 of the air channel 204 with the coil or the iron core of the high-power electromagnetic assembly after installation. Therefore, the air channel 204 with the opening 205 blocked by the insulating seal 207 is suitable for removing the heat by means of liquid medium (e.g., water or antifreeze mixture of water and ethylene glycol).

The other part of the structure of the eighth heat sink is the same as that of the third heat sink, and the detailed description thereof is omitted herein.

The insulating seal 207 is suitable not only for the eighth heat sink, but also for the other heat sinks having openings.

Ninth Heat Sink

Figure 15A:
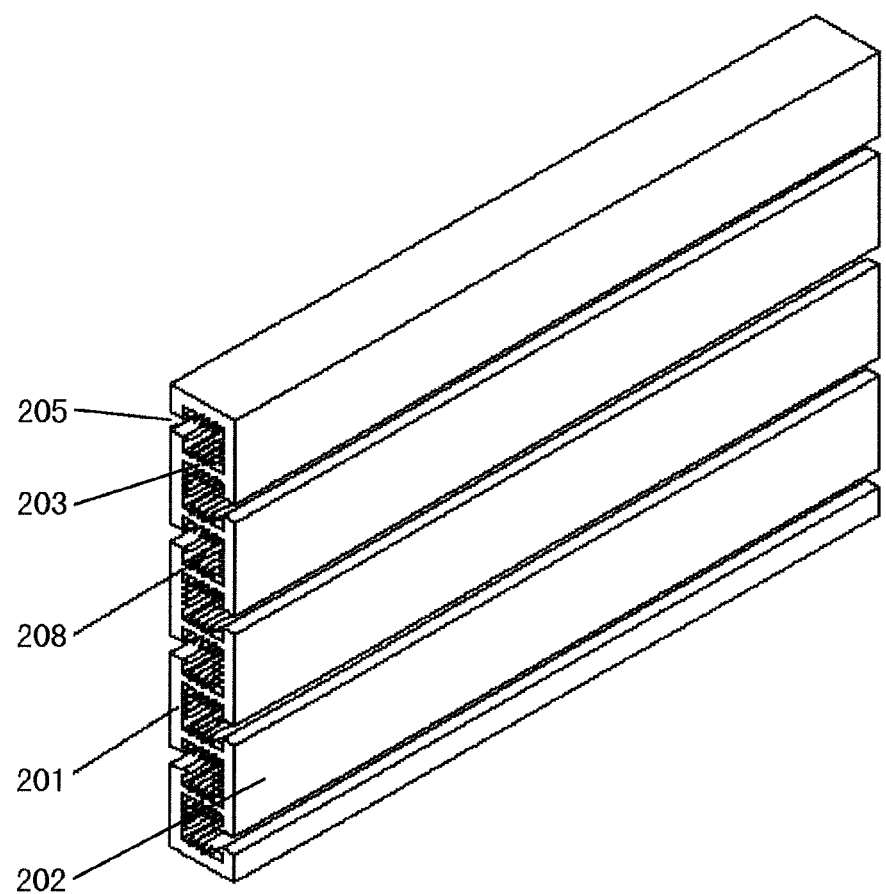
FIG. 15A is a perspective schematic view of the ninth heat sink of the high-power electromagnetic assembly in the present disclosure.
Figure 15B:
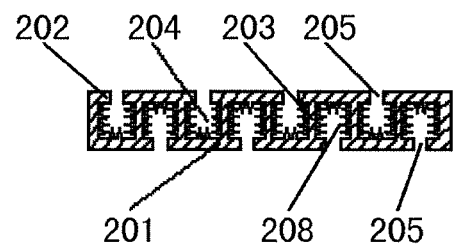
FIG. 15B is a section view of the ninth heat sink shown in FIG. 15A.

Referring to FIGS. 15A and 15B, the difference between the ninth heat sink and the second heat sink of the present high-power electromagnetic assembly is that one or multiple fins 208 are provided on the inner walls of each air channel 204 along the longitudinal direction of the air channel 204 (i.e., airflow direction). The fins 208 may be parallel to the air channel 204 or spiral-shaped, i.e., the fins 208 are provided on the inner walls of the air channel 204 in a spiral manner. The fins 208 can increase the airflow disturbance, the heat exchange area, the dissipation ability and efficiency. Of course, it is possible that only a part of the air channels 204 is provided with the fins 208. Other part of the air channels 204 is not provided with the fins 208 to have a smooth inner wall surface.

The other part of the structure of the ninth heat sink is the same as that of the second heat sink, and the detailed description thereof is omitted herein.

The fins 208 of the ninth heat sink is suitable not only for the second heat sink, but also for the other heat sinks of the present disclosure.

Tenth Heat Sink

Figure 16A:
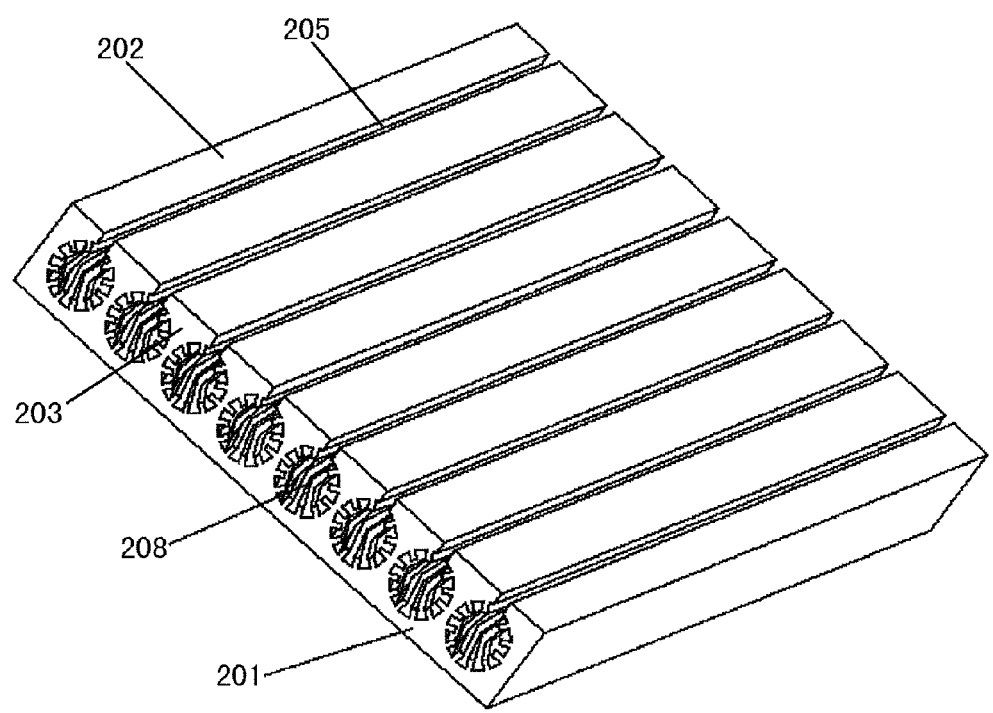
FIG. 16A is a perspective schematic view of the tenth heat sink of the high-power electromagnetic assembly in the present disclosure.
Figure 16B:
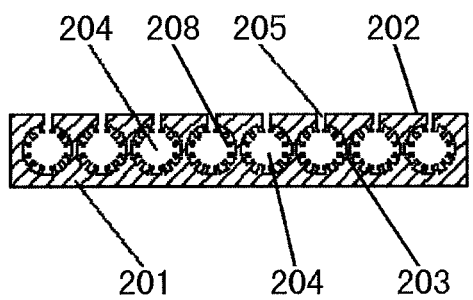
FIG. 16B is a section view of the tenth heat sink shown in FIG. 16A.

Referring to FIGS. 16A and 16B, the difference between the tenth heat sink and the ninth heat sink is that the cross section of the air channel 204 is circular-shaped. The inner wall of the air channel 204 is provided with the fins 208. The structure and arrangement of the fins 208 is the same as that of the ninth heat sink and the detailed description is omitted herein. In addition, the manufacture method of the tenth heat sink may include the following steps: punching multiple holes spaced apart from each other and arranged in a row in a thick metal plate as the air channel 204, the portion between the adjacent air channels 204 acting as the supporting structure 203; defining the opening 205 connecting with the medium channel 204 and corresponding to each air channel 204 on one side. The one side may corresponds to the second panel 202, and the opposite side may correspond to the first panel 201. The multiple openings 205 may be totally defined on the first panel 201 and not on the second panel 202, or on both the first panel 201 and the second panel 202.

The other part of the structure of the tenth heat sink is the same as that of the ninth heat sink, and the detailed description is omitted herein.

Eleventh Heat Sink

Figure 17A:
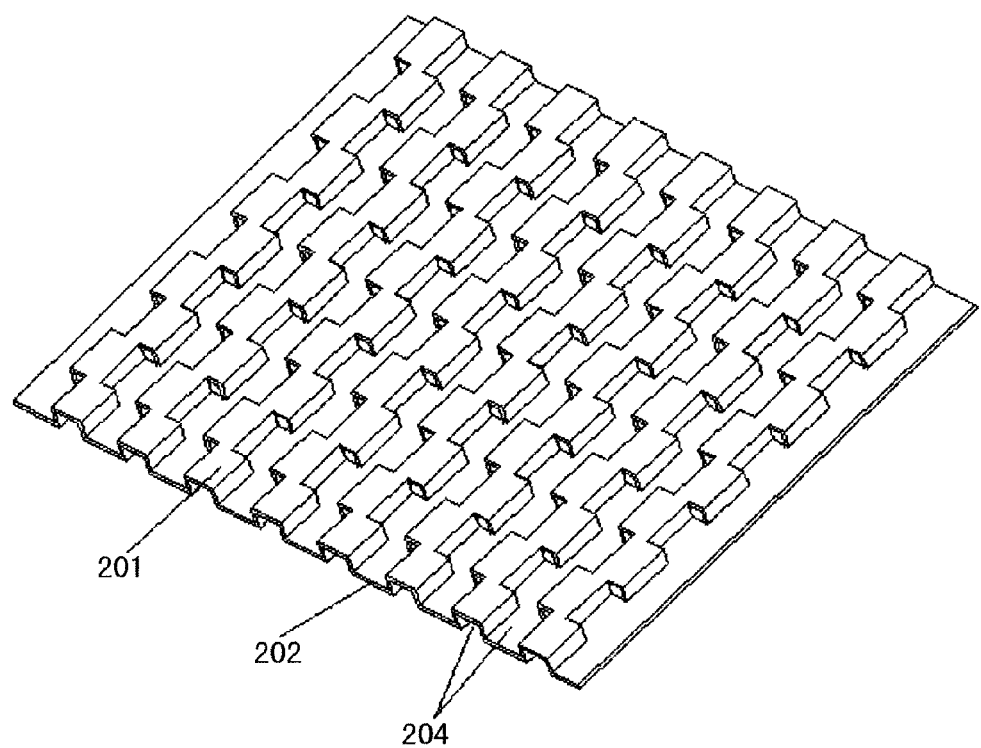
FIG. 17A is a perspective schematic view of the eleventh heat sink of the high-power electromagnetic assembly in the present disclosure.
Figure 17B:
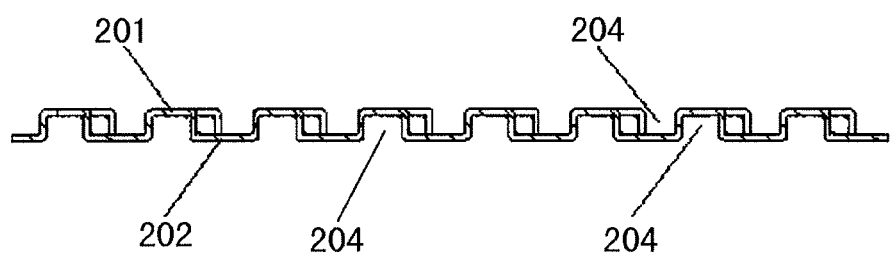
FIG. 17B is a section view of the eleventh heat sink shown in FIG. 17A.

Referring to FIGS. 17A and 17B, the eleventh heat sink of the present high-power electromagnetic assembly includes a heat sink body with a first panel 201, a second panel 202 and multiple air channels 204. The air channel 204 comprises multiple air channel portions having an identical opening direction. Adjacent air channel portions partially offset each other, and the overlapping portions communicate with each other for the airflow passing through. The first panel 201 and the second panel 202 of the eleventh heat sink are in close contact with the coil layer and the iron core of the high-power electromagnetic assembly respectively to constitute the thermal interface, or the first panel 201 and the second panel 202 of the heat sink are in close contact with the adjacent coil layers of the high-power electromagnetic assembly respectively to constitute the thermal interface. In this case, the air channels 204 are closed by the coil layer in close contact with the first panel 201 and the iron core in close contact with the second panel 202, thereby constituting the independent air channel 204 with the closed sidewall and the inner surface for heat exchange surface. In the eleventh heat sink, the shape of the air channel may be selected from the group including U-shape, triangle shape with an opening, semicircular shape, trapezoidal shape with an opening.

In light of the above technical solutions, the advantage and effect of the high-power electromagnetic assembly in the present disclosure are as the following. In the high-power electromagnetic assembly of the present disclosure, the heat sinks are arranged between the iron core and the adjacent coil layer and/or between adjacent coil layers. The heat sinks using the air as the cooling medium can aid the iron core and/or the coil in dissipating heat and have good cooling effect without any additional device, and thereby high-power electromagnetic assembly has simple structure, reliable safety and low cost. Meanwhile, since the manufacturing method may employ the conventional coil-winding process and equipment that the heat sinks are sandwiched between the iron core and the coil or between adjacent coil layers, thereby the high-power electromagnetic assembly has simple and convenient manufacturing process.

It should be noted that the above embodiments is only illustrated for describing the technical solution of the invention and not restrictive, and although the invention is described in detail by referring to the aforesaid embodiments, the skilled in the art should understand that the aforesaid embodiments can be modified and portions of the technical features therein may be equally changed, which does not depart from the spirit and scope of the technical solution of the embodiments of the invention.

What is claimed is:

1. A high-power electromagnetic assembly, comprising a coil having at least two coil layers, wherein a heat sink is provided between adjacent coil layers to aid dissipating heat from the coil, an air channel is formed inside the heat sink along its longitudinal direction, the air channel is also provided between two adjacent coil layers to aid dissipating heat from the coil, and the longitudinal direction of the air channel of the heat sink is substantially consistent with an axial direction of the coil.

2. The high-power electromagnetic assembly according to claim 1, wherein the heat sink is in close contact with at least one of the adjacent coil layers.

3. The high-power electromagnetic assembly according to claim 1, wherein an insulating layer is provided between the heat sink and at least one of the adjacent coil layers.

4. The high-power electromagnetic assembly according to claim 1, wherein opposite ends of the heat sink are level with opposite ends of the coil, respectively; or
wherein one of opposite ends of the heat sink is level with one of opposite ends of the coil, and the other of opposite ends of the coil is beyond the other of opposite ends of the heat sink; or
wherein opposite ends of the coil are beyond opposite ends of the heat sink, respectively.

5. A high-power electromagnetic assembly comprising an iron core and a coil winding around the iron core having at least one coil layer, wherein a heat sink is provided between the iron core and an adjacent coil layer and/or between two adjacent coil layers if there are at least two coil layers to aid the coil in dissipating heat from the coil and/or the iron core, an air channel is formed inside the heat sink along its longitudinal direction, the air channel is also provided between two adjacent coil layers to aid dissipating heat from the coil, and the longitudinal direction of the air channel of the heat sink is substantially consistent with an axial direction of the coil.

6. The high-power electromagnetic assembly according to claim 5, wherein the heat sink is in close contact with at least one of the iron core and the adjacent coil layer, and/or the heat sink is in close contact with at least one of adjacent coil layers.

7. The high-power electromagnetic assembly according to claim 5, wherein an insulating layer is provided between the heat sink and at least one of the iron core and the adjacent coil layer, and/or an insulating layer is provided between the heat sink and at least one of adjacent coil layers.

8. The high-power electromagnetic assembly according to claim 5, wherein opposite ends of the heat sink are level with opposite ends of the coil; or
wherein one of opposite ends of the heat sink is level with one of opposite ends of the coil, and the other of the opposite ends of the coil is beyond the other of the opposite ends of the heat sink; or
opposite ends of the coil are beyond opposite ends of the heat sink, respectively.

9. The high-power electromagnetic assembly according to claim 5, wherein a space enclosed by the iron core is referred to as an inner space of the iron core, and opposite ends of the coil are respectively beyond opposite ends of the heat sink in the inner space of the iron core.

10. The high-power electromagnetic assembly according to claim 5, wherein an air gap is provided at a middle portion of the iron core wound around by the coil, the heat sinks are provided between the air gap and one of opposite ends of the coil and between the air gap and the other of opposite ends of the coil, and a distance between two heat sinks on both sides of the air gap is larger than that the air gap of the iron core.

11. A high-power electromagnetic assembly comprising a coil having at least two coil layers, or comprising an iron core and a coil winding around the iron core, wherein
a heat sink is provided between two adjacent coil layers and/or between the iron core and an adjacent coil layer,
the heat sink comprises a first panel, a second panel and multiple supporting structures in connection with the first and second panels,
the first panel, the second panel and the supporting structures together constitute multiple air channels for cooling airflows passing therethrough,
at least one air channel of the multiple air channels is formed inside the heat sink along its longitudinal direction,
the at least one air channel is also provided between two adjacent coil layers to aid in dissipating heat from the coil, and
the longitudinal direction of the at least one air channel is substantially consistent with an axial direction of the coil.

12. The high-power electromagnetic assembly according to claim 11, wherein at least some of the air channels are provided with openings, and no conductive loop is formed on a cross section perpendicular to an airflow direction of the air channels having the openings.

13. The high-power electromagnetic assembly according to claim 12, wherein the openings are defined on the first panel and/or the second panel.

14. The high-power electromagnetic assembly according to claim 13, the first panel and/or the second panel being in close contact with the iron core or the coil layer to close the openings.

15. The high-power electromagnetic assembly according to claim 13, wherein each air channel is provided with an opening, adjacent openings of the air channels are defined on the first panel and the second panel respectively, and the openings on the first panel alternate with those on the second panel.

16. The high-power electromagnetic assembly according to claim 13, wherein a total area of all openings on the first panel is less than 50% of an area of the first panel, and a total area of all openings on the second panel is less than 50% of an area of the second panel.

17. The high-power electromagnetic assembly according to claim 13, wherein each air channel is provided with an opening, and all of the openings are defined on the first panel or the second panel.

18. The high-power electromagnetic assembly according to claim 11, wherein the first panel is parallel to the second panel.

19. The high-power electromagnetic assembly according to claim 18, wherein both the first panel and the second panel are flat shaped or arc-plate shaped.

20. The high-power electromagnetic assembly according to claim 11, wherein the first panel, the second panel and the supporting structures are made of metal material.

21. The high-power electromagnetic assembly according to claim 11, wherein the cross section of the air channel has a rectangular shape, a triangular shape, a trapezoidal shape, a circular shape or an oval shape.

22. The high-power electromagnetic assembly according to claim 11, wherein each air channel is provided with at least one fin.

23. The high-power electromagnetic assembly according to claim 22, wherein the fin is parallel to the air channel or has a spiral shape.

24. The high-power electromagnetic assembly according to claim 12, wherein each opening is provided with an insulating seal.

25. The high-power electromagnetic assembly according to claim 11, wherein the heat sink further comprises a middle substrate between the first panel and the second panel, the multiple supporting structures being in connection with the first panel and the middle substrate and in connection with the second panel and the middle substrate respectively, two layers of multiple air channels for the airflow passing through being defined by the first panel, the middle substrate and the supporting structures, and by the second panel, the middle substrate and the supporting structures respectively.

26. The high-power electromagnetic assembly according to claim 25, wherein at least some of the air channels are provided with openings, and no conductive loop is formed on a cross section perpendicular to an airflow direction of the air channels having the openings.

27. The high-power electromagnetic assembly according to claim 26, wherein the openings are defined on the first panel and/or the second panel.

28. The high-power electromagnetic assembly according to claim 25, wherein the first panel, the second panel and the middle substrate are parallel to each other.

29. The high-power electromagnetic assembly according to claim 25, wherein the first panel, the second panel and the middle substrate are made of metal material.

30. The high-power electromagnetic assembly according to claim 25, wherein the cross section of each air channel has a rectangular shape, a triangular shape, a trapezoidal shape, a circular shape or an oval shape.

31. The high-power electromagnetic assembly according to claim 25, wherein the air channel is provided with at least one fin.

32. The high-power electromagnetic assembly according to claim 31, wherein the fin is parallel to the air channel or has a spiral shape.

33. The high-power electromagnetic assembly according to claim 26, wherein each opening is provided with an insulating seal.

34. The high-power electromagnetic assembly according to claim 11, wherein the heat sink comprises a heat sink body, the multiple air channels are defined in the heat sink body, and the at least one air channel comprises multiple air channel portions having an identical opening direction, wherein adjacent air channel portions partially offset each other, and overlapping portions communicate with each other for airflow passing therethrough.

35. The high-power electromagnetic assembly according to claim 34, wherein the cross section of each air channel has a U-shape, a triangular shape with an opening, a semi-circular shape, or a trapezoidal shape with an opening.

* * * * *